(12) United States Patent
Yamamuro et al.

(10) Patent No.: US 8,436,351 B2
(45) Date of Patent: May 7, 2013

(54) ZNO-CONTAINING SEMICONDUCTOR LAYER AND ZNO-CONTAINING SEMICONDUCTOR LIGHT EMITTING DEVICE

(75) Inventors: Tomofumi Yamamuro, Kawasaki (JP); Michihiro Sano, Odawara (JP); Naochika Horio, Yokohama (JP); Hiroyuki Kato, Yokohama (JP); Akio Ogawa, Yamato (JP); Hiroshi Kotani, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 124 days.

(21) Appl. No.: 12/969,304

(22) Filed: Dec. 15, 2010

(65) Prior Publication Data

US 2011/0084275 A1 Apr. 14, 2011

Related U.S. Application Data

(62) Division of application No. 12/165,794, filed on Jul. 1, 2008, now Pat. No. 7,968,905.

(30) Foreign Application Priority Data

Jul. 6, 2007 (JP) ................................ 2007-178402

(51) Int. Cl.
*H01L 33/28* (2010.01)
(52) U.S. Cl.
USPC ........ 257/43; 257/88; 257/102; 257/E33.022; 257/E33.041
(58) Field of Classification Search ............ 438/22, 438/28, 34, 35; 428/824, 845.1; 349/26; 257/10, 79, 89, 90, 101, 102, 103, 200, 201, 257/257/E33.37, 43, 88, E33.003, E33.03, 257/7, E33.41, E33.22 E See application file for complete search history.

(56) References Cited

U.S. PATENT DOCUMENTS

| | | |
|---|---|---|
| 6,340,824 B1 | 1/2002 | Komoto et al. |
| 6,939,731 B2 | 9/2005 | Ishizaki |
| 2001/0038426 A1 | 11/2001 | Bechtel et al. |
| 2002/0014631 A1 | 2/2002 | Iwata et al. |
| 2003/0015955 A1 | 1/2003 | Shiiki et al. |
| 2003/0042851 A1 | 3/2003 | Iwata et al. |
| 2003/0153903 A1 | 8/2003 | Kumagi et al. |
| 2004/0056258 A1 | 3/2004 | Tadatomo et al. |

(Continued)

FOREIGN PATENT DOCUMENTS

| | | |
|---|---|---|
| JP | 6-256760 A | 9/1994 |
| JP | 11-087778 A | 3/1999 |

(Continued)

OTHER PUBLICATIONS

Merita, S. et al, "Oxygen in sputter-deposited ZnTe thin films," phys. stat. col. (c)3, No. 4, pp. 960-963 (2006).

(Continued)

*Primary Examiner* — Olik Chaudhuri
*Assistant Examiner* — Quovaunda V Jefferson
(74) *Attorney, Agent, or Firm* — Holtz, Holtz, Goodman & Chick, P.C.

(57) ABSTRACT

A ZnO-containing semiconductor layer contains Se added to ZnO and has an emission peak wavelength of ultraviolet light and an emission peak wavelength of visual light. By combining the ZnO-containing semiconductor layer with phosphor or a semiconductor which is excited by the emitted ultraviolet light and emits visual light, visual light at various wavelengths can be emitted.

16 Claims, 15 Drawing Sheets

| | SUBSTRATE | Zn BEAM FLUX QUANTITY | OXYGEN GAS INTRODUCING QUANTITY OF O RADICAL BEAM | RF POWER FOR PLASMA OF OXYGEN GAS | Se BEAM FLUX QUANTITY | Se CONCENTRATION OF ZnO(Se) |
|---|---|---|---|---|---|---|
| 1ST EMBODIMENT | ZnO | 1.97E14 | 2 sccm | 300W | 2.5E12 | 0.26% |
| 2ND EMBODIMENT | ZnO | 3.29E14 | 2 sccm | 300W | 2.5E12 | 0.03% |
| 3RD EMBODIMENT | ZnO | 1.97E14 | 3 sccm | 350W | 2.5E12 | 0.22% |
| 4TH EMBODIMENT | ZnO | 1.97E14 | 3 sccm | 300W | 2.5E12 | — |

U.S. PATENT DOCUMENTS

| | | |
|---|---|---|
| 2006/0175956 A1 | 8/2006 | Lai |
| 2008/0164467 A1 | 7/2008 | Sano et al. |
| 2011/0027922 A1 | 2/2011 | Sano et al. |

FOREIGN PATENT DOCUMENTS

| | | |
|---|---|---|
| JP | 2002-176198 A | 6/2002 |
| JP | 2003-305058 A | 10/2003 |
| JP | 2004-123764 A | 4/2004 |
| JP | 2004-296459 A | 10/2004 |
| JP | 2006-216926 A | 8/2006 |
| WO | WO 2007/015330 A1 | 2/2007 |

OTHER PUBLICATIONS

Japanese Office Action dated Sep. 4, 2012 (and English translation thereof) in counterpart Japanese Application No. 2007-178402.

Japanese Office Action dated May 8, 2012 (and English translation thereof) in counterpart Japanese Application No. 2007-178402.

FIG.2A

| | SUBSTRATE | Zn BEAM FLUX QUANTITY | OXYGEN GAS INTRODUCING QUANTITY OF O RADICAL BEAM | RF POWER FOR PLASMA OF OXYGEN GAS | Se BEAM FLUX QUANTITY | Se CONCENTRATION OF ZnO(Se) |
|---|---|---|---|---|---|---|
| 1ST EMBODIMENT | ZnO | 1.97E14 | 2 sccm | 300W | 2.5E12 | 0.26% |
| 2ND EMBODIMENT | ZnO | 3.29E14 | 2 sccm | 300W | 2.5E12 | 0.03% |
| 3RD EMBODIMENT | ZnO | 1.97E14 | 3 sccm | 350W | 2.5E12 | 0.22% |
| 4TH EMBODIMENT | ZnO | 1.97E14 | 3 sccm | 300W | 2.5E12 | --- |

ZNO-CONTAINING SEMICONDUCTOR LAYER AND ZNO-CONTAINING SEMICONDUCTOR LIGHT EMITTING DEVICE

CROSS REFERENCE TO RELATED APPLICATION

This is a Divisional Application of U.S. application Ser. No. 12/165,794, filed Jul. 1, 2008 now U.S. Pat. No. 7,968,905, which is based on and claims the benefit of priority from Japanese Patent Application No. 2007-178402, filed Jul. 6, 2007, the entire contents of both of which are incorporated herein by reference.

BACKGROUND OF THE INVENTION

A) Field of the Invention

The present invention relates to a ZnO-containing semiconductor layer and a ZnO-containing semiconductor light emitting device, and more particularly to a ZnO-containing semiconductor layer and a ZnO-containing semiconductor light emitting device, capable of emitting visual light. Semiconductor which contains ZnO and has the same crystalline structure as that of ZnO is called ZnO-containing semiconductor.

B) Description of the Related Art

Zinc oxide (ZnO) is direct transition type semiconductor having a band gap of 3.37 eV at a room temperature and an exciton binding energy of 60 meV higher than that of other semiconductors, and is expected as high efficiency light emission material. As a portion of Zn is substituted with Mg, a band gap becomes large.

An inter-band transition energy of ZnO is equivalent to an emission energy in an ultraviolet range at a wavelength of 370 nm This wavelength is shorter than a visual light range not shorter than 400 nm having particularly a high value of industrial applications.

Research on narrowing a band gap of ZnO (gap narrowing) has been made in order to realize emission at a wavelength longer than 400 nm.

S. Merita, T. Kramer, B. Mogwitz, B. Franz, A. Polity and B. K. Meyer, phys. stat. sol. (c)3, No. 4, 960-963 (2006) have reported a change in a band gap of mixed crystal obtained by substituting O of ZnO with an element of group VI, specifically, with sulfur (S) or selenium (Se). As shown in FIG. 14, mixed crystals of $ZnO_{1-x}S_x$ and $ZnO_{1-x}Se_x$ show band bowing. Narrow gap can be realized by substituting O with S or Se.

It has been desired to develop ZnO-containing semiconductor material suitable for visual light emission.

SUMMARY OF THE INVENTION

An object of the present invention is to provide a ZnO-containing semiconductor crystal layer having novel emission characteristics capable of visual light emission, and a ZnO-containing semiconductor light emitting device using the ZnO-containing semiconductor crystal layer.

According to one aspect of the present invention, there is provided a ZnO-containing semiconductor layer containing Se or S added to ZnO, and having an emission peak wavelength of ultraviolet light and an emission peak wavelength of visual light.

According to another aspect of the present invention, there is provided a ZnO-containing semiconductor light emitting device comprising: a first semiconductor layer of a first conductivity type; a second semiconductor layer of a second conductivity type opposite to the first conductivity type; an emission layer including a ZnO-containing semiconductor layer sandwiched between the first and second semiconductor layers; a first electrode electrically connected to the first semiconductor layer; and a second electrode electrically connected to the second semiconductor layer, wherein the ZnO-containing semiconductor layer contains Se or S added to ZnO and has an emission peak wavelength of ultraviolet light and an emission peak wavelength of visual light.

For example, of ultraviolet light and visual light emitted from the ZnO-containing semiconductor layer, the ultraviolet light is subjected to wavelength conversion to generate visual light having a peak wavelength different from that of the visual light emitted from the ZnO-containing semiconductor layer, and the generated visual light is mixed with the visual light emitted from the ZnO-containing semiconductor layer to thus allow light of various colors to be emitted.

BRIEF DESCRIPTION OF THE DRAWINGS

FIG. 2A is a table showing an outline of growth conditions of a ZnO(Se) layer and Se concentrations of formed ZnO(Se) layers according to first to fourth embodiments.

DESCRIPTION OF THE PREFERRED EMBODIMENTS

Figure 1:
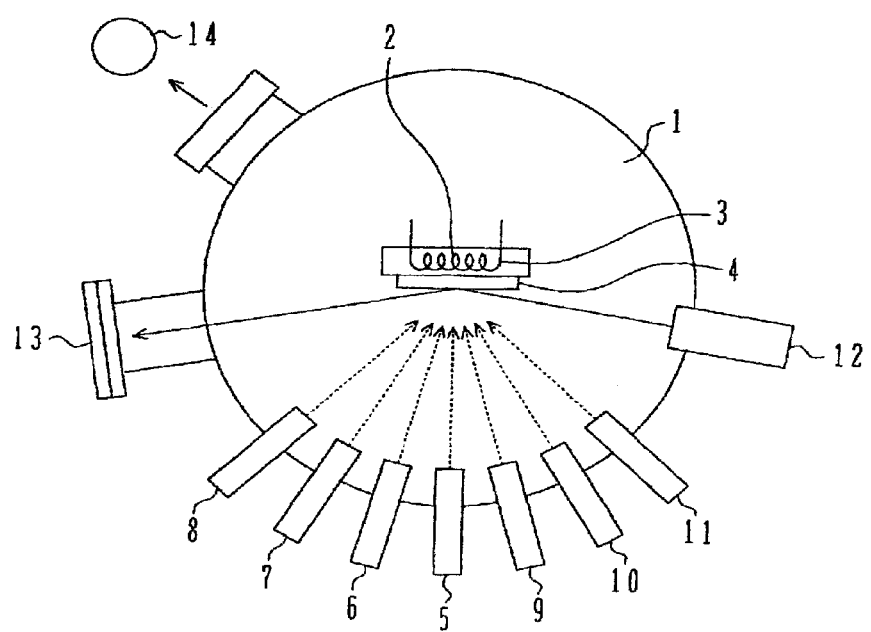
FIG. 1 is a schematic diagram showing an example of a film forming system for growing a ZnO-containing compound semiconductor layer.

With reference to FIG. 1, description will be made on an example of a crystal manufacture system for growing a zinc oxide (ZnO)-containing compound semiconductor layer. Molecular beam epitaxy (MBE) is used as a film forming method.

In an ultra high vacuum chamber 1 a stage 3 including a substrate heater 2 is disposed, and a substrate 4 is held by the stage 3. The substrate 4 may be a sapphire ($Al_2O_3$) substrate, a silicon carbide (SiC) substrate, a gallium nitride (GaN) substrate, a ZnO substrate or the like. The smaller the lattice mismatch of the substrate is, a ZnO-containing compound semiconductor layer has better crystallinity It is therefore most preferable to use a ZnO substrate.

The ultra high vacuum chamber 1 is equipped with a zinc (Zn) source gun 5, an oxygen (O) source gun 6, a selenium (Se) source gun 7, a zinc sulfide (ZnS) source gun 8, a nitrogen (N) source gun 9, a gallium (Ga) source gun 10 and a magnesium (Mg) source gun 11. Relative to group II-VI compound semiconductor, a group V element N is a p-type impurity and a group III element Ga is an n-type impurity.

The Zn source gun 5, ZnS source gun 8, Ga source gun 10 and Mg source gun 11 have Knudsen cells for accommodating Zn, ZnS, Ga and Mg solid sources, respectively, and the Se source gun 7 has an SUMO cell for accommodating an Se solid source, to radiate Zn, ZnS, Ga, Mg and Se beams, respectively.

Instead of the ZnS source gun for the S source, an S source gun for radiating an S beam may be used.

The O source gun 6 and N source gun 9 have electrodeless discharge tubes at a radio frequency (e.g., 13.56 MHz) and radiate O and N radical beams, respectively, by making oxygen and nitrogen gases be radical in the electrodeless discharge tubes.

A ZnO-containing compound semiconductor layer having a desired composition can be formed by supplying the substrate 4 with desired beams at desired timings.

A reflection high-energy electron diffraction (RHEED) gun 12 and a screen 13 on which an RHEED image is projected are also mounted on the ultra high vacuum chamber 1. Crystallinity of a ZnO-containing compound semiconductor layer formed on the substrate 4 can be evaluated from an RHEED image. An exhaust pump 14 evacuates the inside of the ultra high vacuum chamber 1. Ultra high vacuum is a vacuum at a pressure not higher than $1 \times 10^{-7}$ Torr.

Next, description will be made on a growth method for an Se doped ZnO layer (ZnO(Se) layer) according to the first embodiment. First, the +c plane (Zn plane) of a c plane ZnO substrate was subjected to thermal annealing to clean the substrate surface. The thermal annealing was performed for 30 minutes at 900° C. under a high vacuum of $1 \times 10^{-9}$ Torr.

Next, a Zn beam and an O radical beam were radiated at the same time to the +c plane of the ZnO substrate to grow a ZnO buffer layer. The substrate temperature was set to 350° C. The Zn beam was radiated at a beam flux of $9.86 \times 10^{13}$ atoms/($cm^2$sec) (hereinafter, a representation like E+13 atoms/($cm^2$sec) for x $10^{13}$ atoms/($cm^2$sec) is adopted), by using Zn at a purity of 7N as a solid source. The O radical beam was radiated by supplying pure oxygen gas at a purity of 6N at a flow rate of 2 sccm and making O plasma at a radio frequency (RF) power of 300 W.

Next, the ZnO buffer layer was annealed at a substrate temperature of 800° C. The substrate was maintained at 800° C. for 20 minutes. Crystallinity of the buffer layer can be improved by depositing the buffer layer at a low temperature (substrate temperature of, e.g., 350° C.) and thereafter annealing at a high temperature (substrate temperature of, e.g., 800° C.).

Next, a Zn beam, an O radical beam and an Se beam were radiated at the same time to the annealed ZnO buffer layer to grow a ZnO(Se) layer. The substrate temperature was set to 500° C.

The Zn beam was radiated at a beam flux of 1.97E+14 atoms/($cm^2$sec) by using Zn at a purity of 7N as a solid source. The 0 radical beam was radiated by supplying pure oxygen gas at a purity of 6N at a flow rate of 2 sccm and making O plasma at an RF power of 300 W. The Se beam was radiated at a beam flux not more than 2.5E+12 atoms/($cm^2$sec) (not more than a detection limit of a flux monitor) by using Se at a purity of 6N as a solid source. A temperature of the Se cell was 110° C.

In this manner, a ZnO(Se) layer was grown having an Se concentration of 0.26% measured by secondary ion mass spectroscopy (SIMS).

Next, description will be made on a growth method for a ZnO(Se) layer according to the second embodiment. The ZnO(Se) layer was formed by a method similar to the first embodiment growth method, excepting that a Zn beam flux during the ZnO(Se) layer forming process is set to 3.29E+14 atoms/($cm^2$sec). In this manner, a ZnO(Se) layer was grown having an Se concentration of 0.03% measured by SIMS.

Next, description will be made on a growth method for a ZnO(Se) layer according to the third embodiment. The ZnO (Se) layer was formed by a method similar to the first embodiment growth method, excepting that an oxygen supplying quantity is set to 3 sccm and an RF power is set to 350 W, during a ZnO(Se) layer forming process. In this manner, a ZnO(Se) layer was growm having an Se concentration of 0.22% measured by SIMS.

Next, description will be made on a growth method for a ZnO(Se) layer according to the fourth embodiment. The ZnO (Se) layer was formed by a method similar to the first embodiment growth method, excepting that a substrate temperature was set to 600° C., an oxygen supplying quantity was set to 3 sccm and an RF power was set to 300 W, during a ZnO(Se) layer forming process.

FIG. 2A is a table showing an outline of growth conditions of a ZnO(Se) layer and Se concentrations of formed ZnO(Se) layers according to the first to fourth embodiments.

Next, description will be made on PL measurement results of ZnO(Se) layers formed by the methods of the first to fourth embodiments.

Figure 2B:
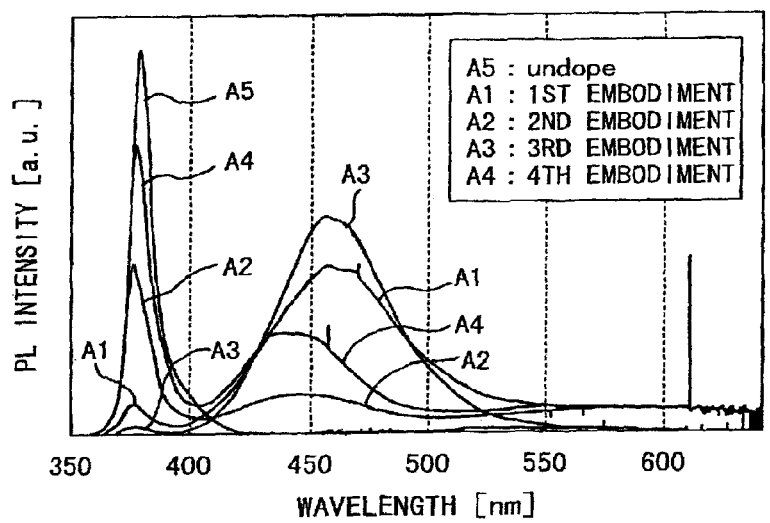
FIG. 2B shows photoluminescence (PL) spectra of the ZnO(Se) layers of the first to fourth embodiments.

FIG. 2B shows PL spectra of the ZnO(Se) layers of the first to fourth embodiments. As an excitation light source for PL measurements, He—Cd laser at a wavelength of 325 nm was used. A measurement temperature was 300 K. The abscissa of the graph represents a wavelength in the unit of nm, and the ordinate represents an emission intensity in an arbitrary unit. An emission intensity of each spectrum is normalized properly in order to draw all spectra in one graph. For the purposes of comparison, an emission intensity (a curve A5 (undoped)) of a ZnO layer without radiating Se is also shown. Curves A1 to A5 are spectra of the first to fourth embodiments and a spectrum of undoped ZnO.

It is remarkable that all the ZnO(Se) layers of the first to fourth embodiments exhibit near ultraviolet light emission having an emission peak near at 380 nm and blue light emission having an emission peak near at 450 nm Undoped ZnO exhibits only ultraviolet light emission near at 380 nm.

Ultraviolet light emission peak wavelengths of the ZnO (Se) layers of the first to fourth embodiments are all 380 nm.

If a quantum well structure is formed by using ZnO, a quantum level is formed. It is known that as a well layer is made thinner, a wavelength of an ultraviolet light emission peak (emission from near at a band edge of ZnO) shifts to the shorter wavelength side.

Figure 13:
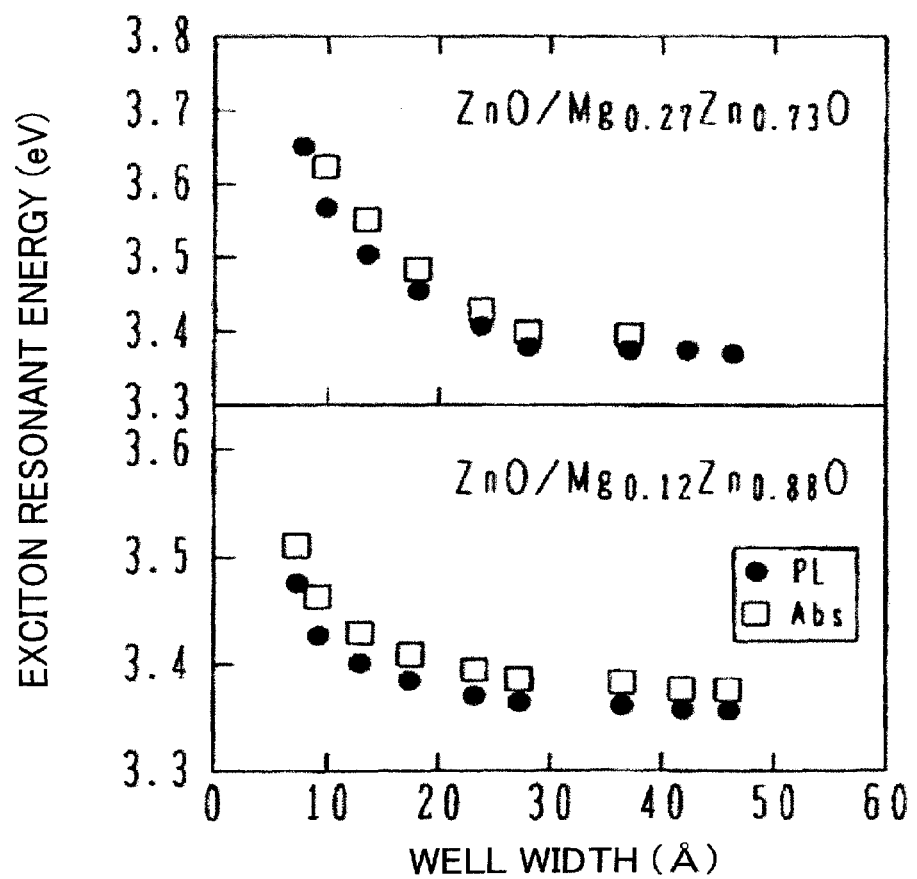
FIG. 13 is a graph showing the relation between a well width and a ZnO emission peak wavelength.
Figure 14:
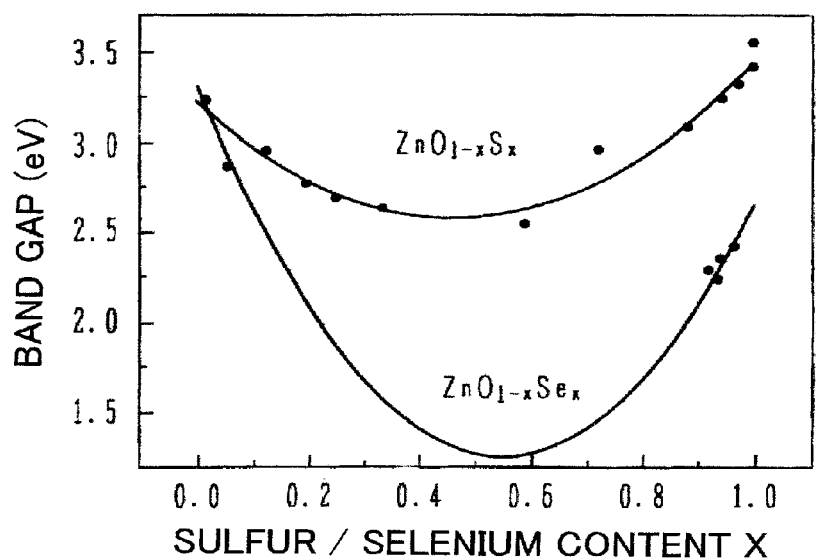
FIG. 14 is a graph showing band gaps of ZnOS and ZnOSe.

As seen from a graph shown in FIG. 13 (the source of which is T. Makino, Y. Segawa, M. Kawasaki, and H. Koinuma, Semicond. Sci. Tchnol. 20 (2005) S78-S91), as a well width is made narrower, a ZnO emission peak shifts to about 3.65 eV (=about 340 nm).

It can be considered that an ultraviolet light emission peak wavelength of a ZnO(Se) layer is in a range of 340 nm to 380 nm.

Visual light emission peak wavelengths of the ZnO(Se) layers of the first to fourth embodiments are 470 nm, 440 nm, 455 nm and 430 nm, respectively.

A visual light emission peak wavelength of the PL spectrum of, e.g., the ZnO(Se) layer of the third embodiment changes from 455 nm to 490 nm as a excitation intensity is changed from 2.0 mA to 0.005 mA.

It can be considered that a visual light emission peak wavelength of a ZnO(Se) layer is in a range of 430 nm to 490 nm.

From comparison between an emission spectrum of undoped ZnO and an emission spectrum of each embodiment, it can be considered that as Se is slightly doped into ZnO crystal, in addition to ultraviolet light emission of ZnO itself near at 380 nm, blue light emission appears newly near at 450 nm by some principle or others dependent on Se.

It is also remarkable that a relative intensity of ultraviolet light emission and blue light emission can be changed by changing the film forming conditions as in the first to fourth embodiments. This suggests therefore that it is possible to form a two-peak light emitting device having an emission intensity ratio suitable for each application.

If both ultraviolet light emission and blue light emission are utilized, it may be preferable that an intensity ratio of one emission to the other has some value or larger. For example, it may be preferable that a ratio of an ultraviolet light emission peak intensity to a blue light emission peak intensity is not smaller than 1/20 and that a ratio of a blue light emission peak intensity to an ultraviolet light emission peak intensity is not smaller than 1/20.

Absorption peaks of the ZnO(Se) layers of the first to fourth embodiments were measured. The absorption peaks were all about 375 nm which corresponded to that of undoped ZnO. Namely, this means that these layers are transparent relative to visual light, e.g., blue light at 450 nm Even if the ZnO(Se) layer of the embodiment and a blue light emission layer are used in combination, it is expected to exhibit a merit that blue light of the emission layer will not be absorbed.

By adding Se to ZnO, both ultraviolet light emission and blue light emission can be obtained from a single ZnO(Se) layer.

For example, GaN-containing materials have been used conventionally as the emission material of a light emitting diode (LED) of ultraviolet light emission or blue light emission. If these materials are used, it is not possible to obtain emission having a peak in an ultraviolet range and emission having a peak in a visible range at the same time from a single layer.

If these materials are used for obtaining, for example, ultraviolet light emission and blue light emission at the same time, it is necessary to manufacture a multiple quantum well structure having a plurality of well layers corresponding to a plurality of emission wavelengths, as disclosed, for example, in JP-A-2002-176198.

By applying the embodiment ZnO(Se) layer, it is expected that a light emitting device can be manufactured which can exhibit ultraviolet light emission and blue light emission at the same time even if a single emission layer is used.

A band gap of ZnO can be narrowed by increasing an Se composition x of $ZnSe_xO_{1-x}$. However, as a dose is increased to the extent that an Se composition x becomes 0.01 or larger, an emission peak corresponding to the narrowed band gap cannot be observed, and only emission at a deep level can be observed (refer to the eighth embodiment and FIG. 7A to be described later). This may be ascribed to lowered crystallinity.

If a $ZnSe_xO_{1-x}$ layer with an Se composition x suppressed lower than 0.01 (lower than 1%) is formed by the embodiment method, it can be considered that while a band gap is maintained as that of ZnO, i.e., while an ultraviolet light emission peak corresponding to the ZnO band gap is maintained, blue light emission peak can be obtained additionally.

Figure 12:
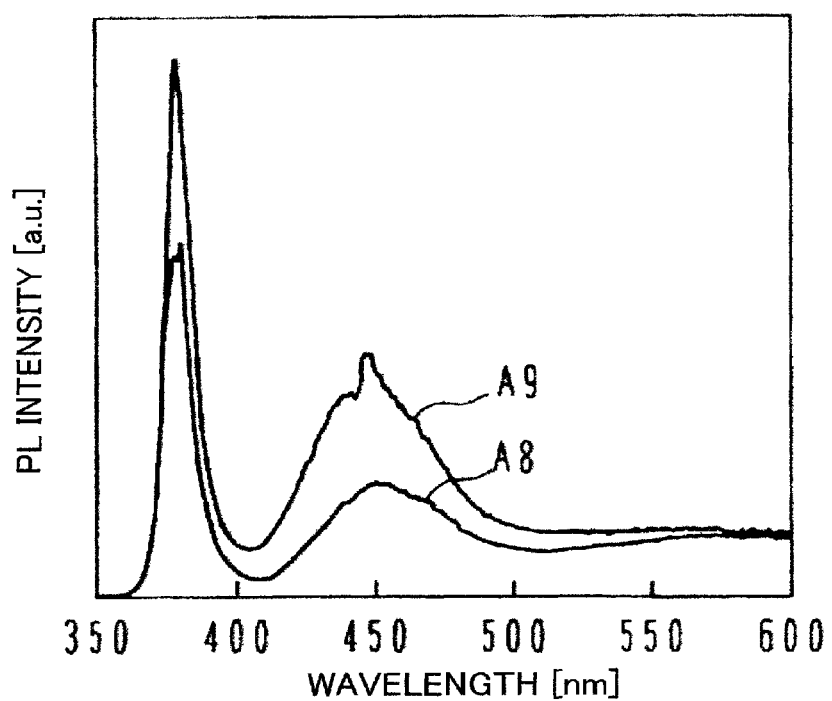
FIG. 12 shows PL spectra of ZnO(Se) layers according to other embodiments.

A ZnO(Se) layer, grown under the conditions of a growth temperature of 500° C., a Zn beam flux of 1.32E+15 atoms/(cm²sec), an Se beam flux of 3.67E+12 atoms/(cm²sec), and for an O radical beam, an oxygen gas supplying quantity of 2 sccm and an RF power of 300 W, had an Se concentration of 0.9%, an ultraviolet light emission peak wavelength of 380 nm and a visual light emission peak wavelength of 455 nm. A curve A8 shown in FIG. 12 indicates a PL spectrum of this ZnO(Se) layer.

A ZnO(Se) layer, grown under the conditions of a growth temperature of 500° C., a Zn beam flux of 1.32E+15 atoms/(cm²sec), an Se beam flux not more than 2.5E+12 atoms/(cm²sec) (not more than a detection limit of a flux monitor, at an Se cell temperature of 110° C.), and for an O radical beam, an oxygen gas supplying quantity of 2 sccm and an RF power of 300 W, had an Se concentration of 0.001%, an ultraviolet light emission peak wavelength of 380 nm and a visual light emission peak wavelength of 450 nm. A curve A9 shown in FIG. 12 indicates a PL spectrum of this ZnO(Se) layer.

It can be considered that a substrate temperature of the ZnO(Se) layer during the growth process is preferably not higher than 700° C. At a temperature higher than 700° C., Se becomes hard to be doped into ZnO because a vapor pressure of Se is much higher than that of ZnO. A lower limit of the substrate temperature during the growth process for the ZnO (Se) layer is considered to be 300° C. If the ZnO(Se) layer is grown at a temperature lower than 300° C., the number of non-radiative sites in crystal increases, and the layer becomes not suitable for an emission layer.

Next, description will be made on a light emitting diode (LED) applying the embodiment ZnO(Se) layer to an emission layer. FIGS. 3A to 3D are schematic cross sectional views of light emitting diodes of the fifth and sixth embodiments.

Figure 3A:
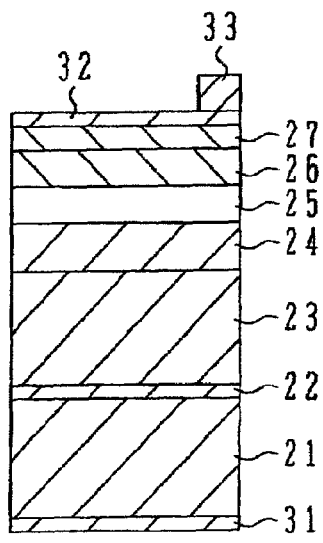
FIG. 3A is a schematic cross sectional view of an LED according to a fifth embodiment.

First, a manufacture method for an LED of the fifth embodiment will be described with reference to FIGS. 3A to 3C. Used as a substrate 21 is a c plane ZnO substrate having an n-type conductivity. An n-type ZnO buffer layer 22 is formed on the c plane.

The n-type ZnO buffer layer 22 is grown by radiating at the same time a Zn beam and an O radical beam to the substrate heated to 300° C. to 500° C. A thickness of the n-type ZnO buffer layer 22 is preferably about 10 nm to 30 nm.

Annealing may further be performed for about 30 minutes at 800° C. to 900° C. By performing annealing at a high temperature after the buffer layer is deposited at a low temperature, crystallinity of the buffer layer can be improved.

Next, on the n-type ZnO buffer layer 22, a Ga doped n-type ZnO layer 23 (n-type contact layer) is formed. The n-type ZnO layer 23 is grown by radiating at the same time a Zn beam, an O radical beam and a Ga beam to the substrate heated to 500° C. to 1000° C. It is preferable that a thickness of the n-type ZnO layer 23 is set to 0.1 μm to 1 μm and a Ga concentration is set not lower than $1\times10^{18}$ cm$^{-3}$.

Next, on the n-type ZnO layer 23, a Ga doped n-type MgZnO layer 24 (n-type clad layer) is formed. The n-type MgZnO layer 24 is grown by radiating at the same time a Zn beam, an O radical beam, a Ga beam and an Mg beam at a substrate temperature lower than that during growth of the n-type ZnO layer 22. It is preferable that a thickness of the n-type MgZnO layer 24 is set to 100 nm to 600 nm and a Ga concentration is set not lower than $1\times10^{18}$ cm$^{-3}$.

In succession, on the n-type MgZnO layer 24, an emission layer 25 is formed. The emission layer 25 has a quantum well structure having a ZnO(Se) layer as a well layer and a ZnMgO layer as a barrier layer.

Figure 3B:
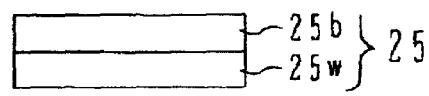
FIGS. 3B and 3C are schematic cross sectional views showing examples of the structure of an emission layer.
Figure 3C:
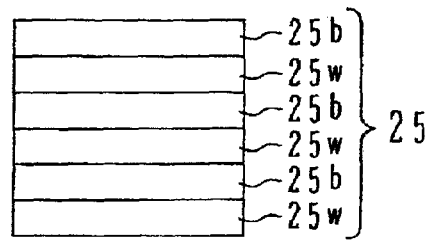

The emission layer 25 is formed, for example, as shown in FIG. 3B, by forming one cycle of a lamination structure having a ZnMgO barrier layer 25b stacked on a ZnO(Se) well layer 25w. The emission layer 25 may be formed, for example, as shown in FIG. 3C, by forming the lamination structure a plurality of cycles to form a multiple quantum well structure.

The ZnO(Se) well layer 25w is formed by methods similar to the first to fourth embodiments. A thickness of one ZnO(Se) well layer is set to 0.1 nm to 10 nm The ZnMgO bather layer 25b is grown by radiating at the same time a Zn beam, an O radical beam and an Mg beam at a substrate temperature of 300° C. to 1000° C. A thickness of one ZnMgO bather layer is set to 3 nm to 20 nm.

Next, on the emission layer 25, an N doped p-type ZnMgO layer 26 (p-type clad layer) is formed. The p-type ZnMgO layer 26 is grown by radiating at the same time a Zn beam, an O radical beam, an Mg beam and an N radical beam to the substrate heated to 300° C. to 1000° C. It is preferable that a thickness of the p-type ZnMgO layer 26 is set to 100 nm to 300 nm and an N concentration is set not lower than $1\times10^{18}$ cm$^{-3}$.

Next, on the p-type ZnMgO layer 26, an N doped p-type ZnO layer 27 (p-type contact layer) is formed. The p-type ZnO layer 27 is grown by radiating at the same time a Zn beam, an O radical beam and an N radical beam to the substrate heated to 500° C. to 1000° C. It is preferable that a thickness of the p-type ZnO layer 27 is set to 100 nm to 200 nm and an N concentration is set not lower than $1\times10^{19}$ cm$^{-3}$. The p-type ZnO layer with N uniformly doped in the layer can therefore be formed.

Next, electrodes are formed. An n-side electrode 31 is formed on the bottom surface of the substrate 21. For example, the n-side electrode 31 is formed by forming a Ti layer of 2 nm to 10 nm thick on the bottom surface of the substrate and stacking an Al layer of 300 nm to 500 nm on the Ti layer.

A p-side electrode 32 is formed on the upper surface of the p-type ZnO layer 27. For example, the p-side electrode 32 is formed by forming an Ni layer of 0.5 nm to 1 nm thick on the p-type ZnO layer 27 and stacking an Au layer of 10 nm thick on the Ni layer. A bonding electrode 33 is formed on the p-side electrode 32. For example, the bonding electrode 33 is made of an Au layer of 500 nm thick.

After these electrodes are formed, an electrode alloying process is executed, for example, in an oxygen atmosphere at 400° C. to 800° C. An alloying process time is, for example, 1 minute to 10 minutes. In this manner, a ZnO-containing LED of the fifth embodiment is manufactured. Although the ZnO substrate having the n-type conductivity is used as the substrate 21, an SiC substrate or a GaN substrate having the n-type conductivity may also be used.

In this embodiment, although the c plane ZnO substrate is used and the semiconductor device is formed on the +c plane, the semiconductor device may be formed on the −c plane. The semiconductor device may also be formed on a ZnO substrate having an a plane or an m plane.

Next, a manufacture method for an LED of the sixth embodiment will be described with reference to FIG. 3D. Different points from the fifth embodiment reside in that an insulating substrate can be used and therefore a different electrode forming process is used. For example, a sapphire substrate is used as a substrate 21a.

Similar to the fifth embodiment, an n-type ZnO buffer layer 22 to a p-type ZnO layer 27 are formed on the substrate 21a. A wafer formed with the layers up to the p-type ZnO layer 27 is picked up from a film forming system, and thereafter a resist film, a protective film (hard mask) or the like is formed on the p-type ZnO layer 27, and patterned to form an etching mask having a cut window corresponding to an area where an n-side electrode is formed. By using this etching mask, the p-type ZnO layer 27 to n-type ZnMgO layer 24 are etched, for example, by wet etching or reactive ion etching, to expose an n-type ZnO layer 23.

Next, a Ti layer having a thickness of, e.g., 10 nm to 100 nm is formed on the surface of the exposed n-type ZnO layer 23, and an Au layer of 100 nm to 1000 nm thick is stacked on the Ti layer, to form an n-side electrode 31a. After the n-side electrode 31a is formed, the etching mask is removed.

Next, on the surface of the p-type ZnO layer 27, for example, an Ni layer of 0.1 nm to 1 nm is formed, and an Au layer of 1 nm to 10 nm is stacked on the Ni layer, to form a p-side transparent electrode 32a. Further, on the p-side electrode 32a, for example, an Ni layer of 100 nm thick is formed, and an Au layer of 1000 nm thick is stacked on the Ni layer, to form a bonding electrode 33a. The p-side electrode 32a and bonding electrode 33a are formed by using proper masks so as not to make the material of the p-side electrode stack on the n-side electrode 31a.

Similar to the fifth embodiment, after these electrodes are formed, an electrode alloying process is executed, for example, in an oxygen atmosphere at 400° C. to 800° C. An alloying process time is, for example, 30 seconds to 10 minutes. In this manner, a ZnO-containing LED of the sixth embodiment is manufactured. Although the sapphire substrate is used as the substrate 21a, a ZnO substrate, an SiC substrate or a GaN substrate may also be used.

LED's of the fifth and sixth embodiments use the ZnO(Se) layer of the first to fourth embodiments as the emission layer so that LED's can realize emission having peaks in the ultraviolet and blue color ranges.

Figure 4A:
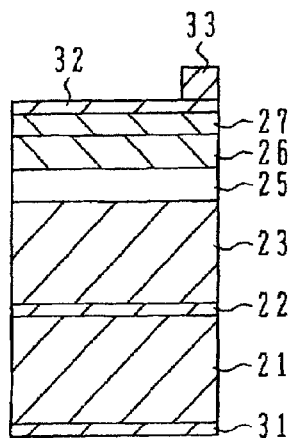
FIGS. 4A to 4D are schematic cross sectional views of LED's according to modifications of the fifth and sixth embodiments.
Figure 4C:
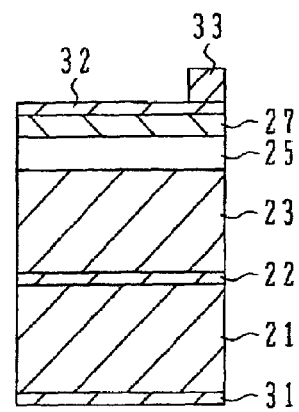
Figure 4B:
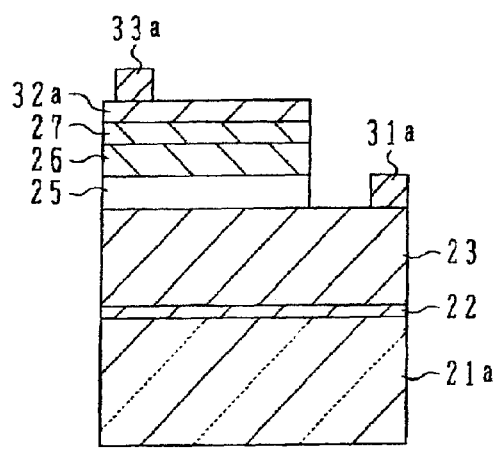
Figure 4D:
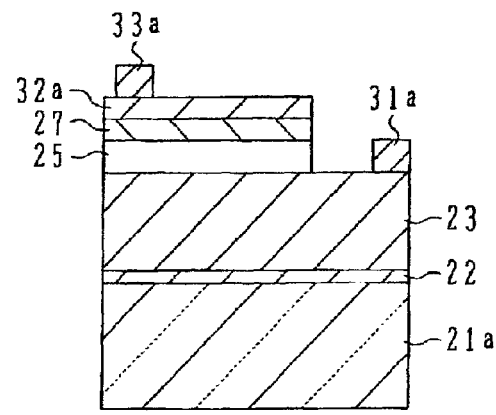

In the fifth and sixth embodiments, the n-type ZnMgO layer 24 disposed under the emission layer 25 may be omitted as shown in FIGS. 4A and 4B. Further, both the p-type ZnMgO layer 26 and n-type ZnMgO layer 24 disposed above and under the emission layer 25 may be omitted as shown in FIGS. 4C and 4D.

In the fifth and sixth embodiments, the emission layer 25 may be a single ZnO(Se) layer. In this case, an LED of a double hetero (DH) structure is formed having a single ZnO(Se) layer 25 sandwiched between the n-type ZnMgO clad layer 24 and p-type ZnMgO clad layer 26.

Next, description will be made on a light projecting apparatus of the seventh embodiment applying LED of the above-described embodiments.

JP-A-2003-305058 discloses a light projecting apparatus for dental photopolymerization composite resin. This light projecting apparatus has two types of LED's as its light source, a blue color light emitting LED having a peak at an emission wavelength of 450 nm or longer and 490 nm or shorter and a near ultraviolet/violet color light emitting LED having a peak at a wavelength of 370 nm or longer and shorter than 410 nm (Publication Paragraph [0019]).

LED of the fifth or sixth embodiment can obtain both ultraviolet light emission near at a wavelength of 380 nm and blue light emission near at a wavelength of 450 nm Two types of LED's disclosed in Publication are expected to be replaced with one LED of the fifth or sixth embodiment. It is expected therefore that the light projecting apparatus for dental photopolymerization composite resin can be made compact and the number of manufacture processes can be reduced.

Figure 5:
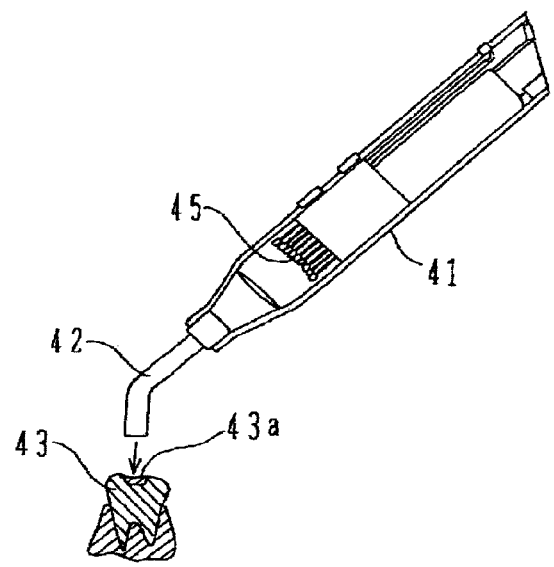
FIG. 5 is a schematic cross sectional view of a light projecting apparatus according to a seventh embodiment.

FIG. 5 is a schematic cross sectional view of a light projecting apparatus of the seventh embodiment. An LED 45 of the embodiment is disposed inside a light projecting apparatus main body 41. Ultraviolet and blue color rays emitted from LED 45 are radiated via a light guide 42 to an external of the apparatus. The ultraviolet and blue color rays guided to the external of the apparatus are radiated to dental photopolymerization composite resin 43a filled in a tooth 43 to photopolymerize the resin 43a.

Figure 6A:
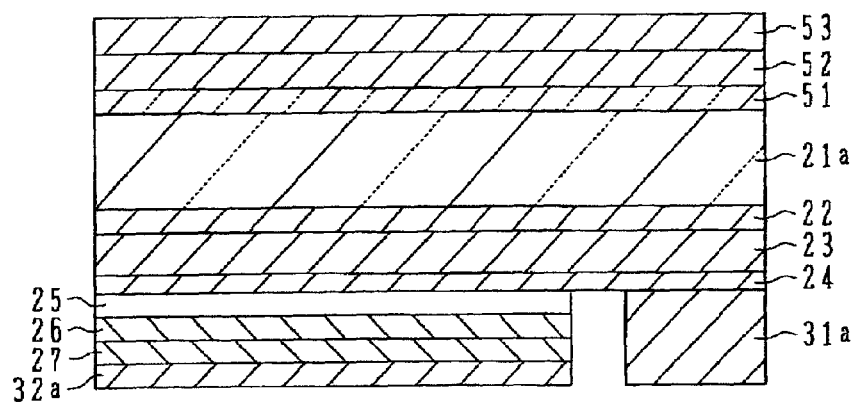
FIG. 6A is a schematic cross sectional view of a white color LED according to an eighth embodiment.
Figure 6B:
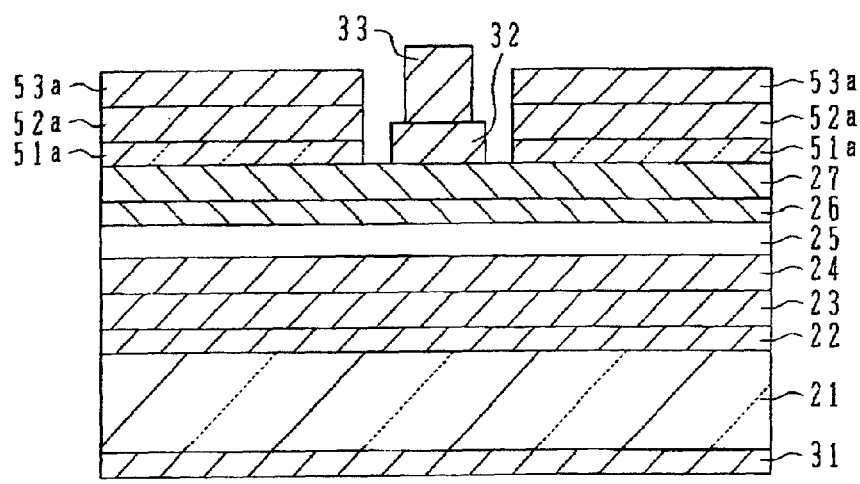
FIG. 6B is a schematic cross sectional view of a white color LED according to a ninth embodiment.
Figure 8:
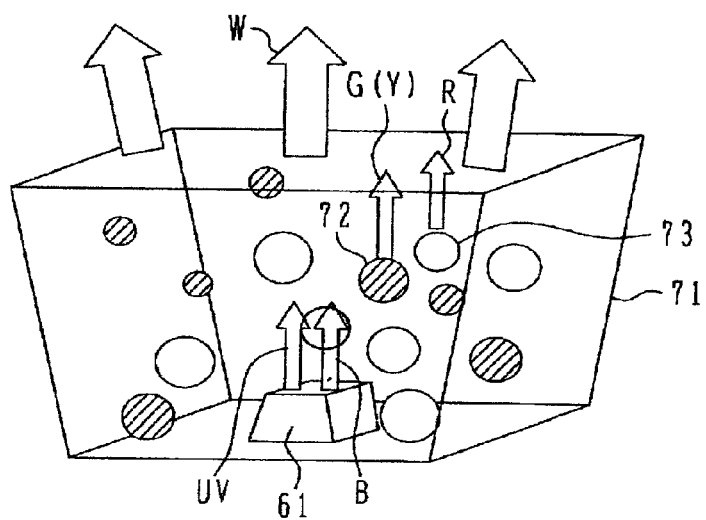
FIG. 8 is a schematic perspective view of a white color LED according to tenth to twelfth embodiments.

Next, description will be made on white color LED's of the eighth to twelfth embodiments applying the white color LED. FIGS. 6A and 6B are schematic cross sectional views of white color LED's of the eighth and ninth embodiments, and FIG. 8 is a schematic perspective of white color LED's of the tenth to twelfth embodiments.

A white color LED of the eighth embodiment will be described with reference to FIG. 6A. The white color LED of the eighth embodiment has two wavelength conversion layers stacked on the LED structure (refer to FIG. 3D) of the sixth embodiment. One wavelength conversion layer is excited by ultraviolet light emitted from the emission layer 25 and emits green light (converts ultraviolet light into green light), and the other wavelength conversion layer is excited by ultraviolet light emitted from the emission layer 25 and emits red light (converts ultraviolet light into red light).

Figure 3D:
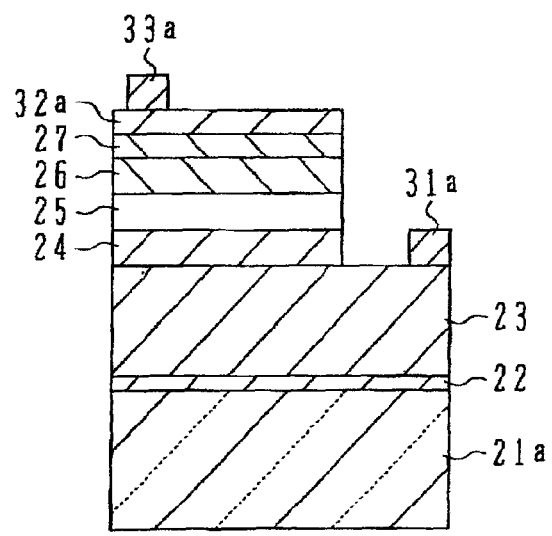
FIG. 3D is a schematic cross sectional view of an LED according to a sixth embodiment.

The portion lower than the substrate 21a shown in FIG. 6A is a structural body obtained by turning LED of the sixth embodiment shown in FIG. 3D upside down. However, the n-side electrode 31a of LED of the embodiment is formed on an n-type ZnMgO layer 24, and the bonding electrode 33a on the p-side electrode 32a is omitted.

The wavelength conversion layer 52 for converting ultraviolet light into green light and the wavelength conversion layer 53 for converting ultraviolet light into red light are stacked via an insulating layer 51 on the surface of the substrate 21a on the side opposite to the side where the emission layer 25 is formed. If the substrate 21a is made of sapphire, the insulating layer 51 can be omitted. The insulating layer 51 is made of material which is transparent relative to ultraviolet light and blue light emitted from the emission layer 25. For example, ZnO may be used.

The wavelength conversion layers 52 and 53 may be formed, for example, by depositing phosphorous substance by coating. Electron beam deposition or sputtering may also be used. Phosphorous substance may be contained in a semiconductor layer. In this case, phosphorous substance is doped simultaneously with a crystal growth process, or implanted into semiconductor crystal, for example, by ion implantation after crystal growth.

$SrAl_2O_4$:Eu or the like may be used as the phosphorous substance of the wavelength conversion layer 52 for converting ultraviolet light emitted from the emission layer 25 into green light. $Y_2O_2$:Eu or the like may be used as the phosphorous substance of the wavelength conversion layer 53 for converting ultraviolet light emitted from the emission layer 25 into red light. A wavelength conversion layer using phosphorous substance is disclosed, for example, in Detailed Description of the Preferred Embodiments of JP-A-HEI-11-87778.

Figure 7A:
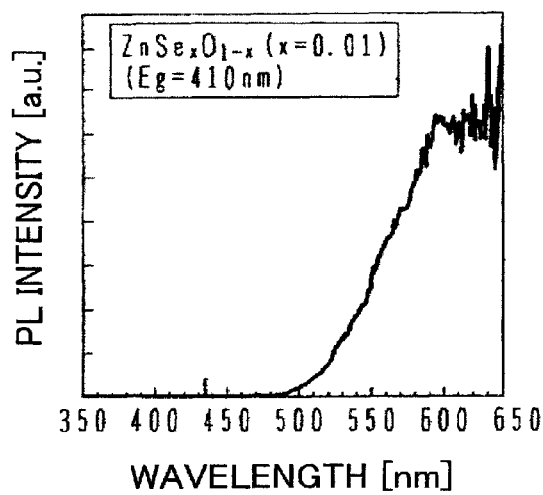
FIG. 7A shows a PL spectrum of $ZnSe_xO_{1-x}$ (x=0.01)

Without using the wavelength conversion layers of phosphorous substance, semiconductor layers may be laminated which perform green light emission and red light emission under excitation of light in the ultraviolet range emitted from the emission layer 25. Material of the wavelength conversion layer 52 for emitting green light may be $ZnS_yO_{1-y}$ ($y \geqq 0.01$), and material of the wavelength conversion layer 53 for emitting red light may be $ZnSe_xO_{1-x}$ ($x \geqq 0.01$). Description will be made on $ZnSe_xO_{1-x}$ ($x \geqq 0.01$) which emits red light. An Se composition x is, for example, 0.01. FIG. 7A shows a PL spectrum of $ZnSe_xO_{1-x}$ (x=0.01). This spectrum shows red light emission having an emission peak near at 630 nm.

The band gap is narrowed by substituting O sites of ZnO with Se to absorb ultraviolet light near at 380 nm emitted from the embodiment ZnO(Se) layer. A band gap energy Eg of $ZnSe_xO_{1-x}$ (x=0.01) corresponds to a wavelength of 410 nm Emission does not occur at the band edge, but occurs at a deep level. This may be ascribed to emission having a peak near at 630 nm.

Description will be made on an example of the growth conditions for $ZnSe_xO_{1-x}$ (x=0.01). Similar to growth of the embodiment ZnO(Se) layer, MBE is used. A Zn beam, an O radical beam and an Se beam are radiated at the same time at a substrate temperature of 500° C.

The Zn beam is radiated at a beam flux of 1.32E+15 atoms/(cm$^2$sec) by using Zn at a purity of 7N as a solid source. The O radical beam is radiated by supplying pure oxygen gas at a purity of 6N at 2 sccm and making oxygen plasma at an RF power of 300 W. The Se beam is radiated at a beam flux of 1.10E+14 atoms/(cm$^2$sec), by using Se at a purity of 6N as a solid source.

Figure 7B:
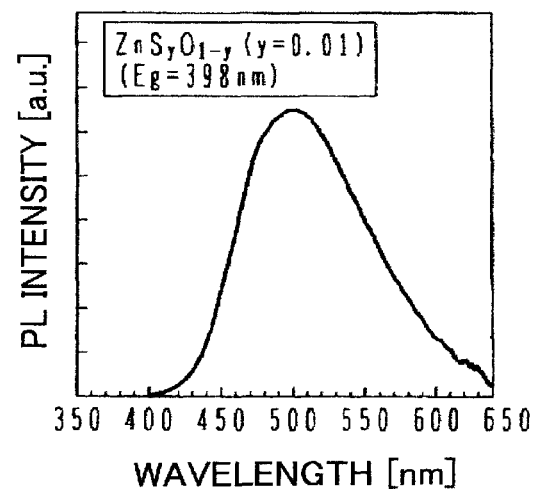
FIG. 7B shows a PL spectrum of $ZnS_yO_{1-y}$ (y=0.01)

Next, description will be made on $ZnS_yO_{1-y}$ ($y \geqq 0.01$) which emits red light. An S composition y is, for example, 0.01. FIG. 7B shows a PL spectrum of $ZnS_yO_{1-y}$ (y=0.01). This spectrum shows green light emission having an emission peak near at 520 nm.

The band gap is narrowed by substituting O sites of ZnO with S to absorb ultraviolet light near at 380 nm emitted from the embodiment ZnO(Se) layer. A band gap energy Eg of $ZnS_yO_{1-y}$ (y=0.01) corresponds to a wavelength of 398 nm Emission does not occur at the band edge, but occurs at a deep level. This may be ascribed to emission having a peak near at 520 nm.

Description will be made on an example of the growth conditions for $ZnS_yO_{1-y}$ (y=0.01). Similar to growth of the embodiment ZnO(Se) layer, MBE is used. A Zn beam, an O radical beam and an ZnS beam are radiated at the same time at a substrate temperature of 600° C.

The Zn beam is radiated at a beam flux of 1.98E+15 atoms/(cm$^2$sec) by using Zn at a purity of 7N as a solid source. The O radical beam is radiated by supplying pure oxygen gas at a purity of 6N at 2 sccm and making oxygen plasma at an RF power of 300 W. The ZnS beam is radiated at a beam flux of 6.08E+15 atoms/(cm$^2$sec), by using ZnS at a purity of 5N as a solid source.

Figure 7C:
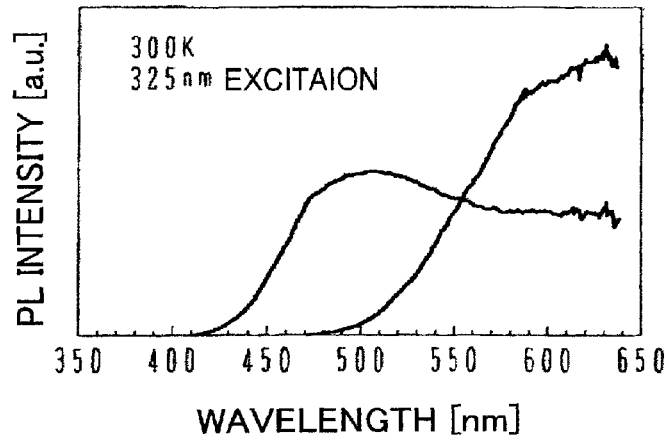
FIG. 7C shows PL spectra of $ZnSe_xO_{1-x}$ (x=0.011) and $ZnS_yO_{1-y}$ (y=0.011).

FIG. 7C shows a PL spectrum (red light emission peak graph) of $SnSe_xO_{1-x}$ (x=0.011) and a PL spectrum (green light emission peak graph) of $ZnS_yO_{1-y}$ (y=0.011).

Next, a white color LED of the ninth embodiment will be described with reference to FIG. 6B. The white color LED of the ninth embodiment has two wavelength conversion layers stacked on the LED structure (refer to FIG. 3A) of the fifth embodiment. One wavelength conversion layer is excited by ultraviolet light emitted from the emission layer 25 and emits green light, and the other wavelength conversion layer is excited by ultraviolet light emitted from the emission layer 25 and emits red light.

Similar to the LED of the fifth embodiment shown in FIG. 3A, layers up to the p-type ZnO layer 27 are laminated in the substrate 21, the n-side electrode 31 is formed on the bottom of the substrate 21, and the p-side electrode 32 and bonding electrode 33 are formed on the p-type ZnO layer 27. However, in LED of this embodiment, the p-side electrode 32 and bonding electrode 33 are formed on the partial upper surface of the p-type ZnO layer 27.

On the upper surface of the p-side ZnO layer 27 in an area where the p-side electrode 32 and bonding electrode 33 are not formed, there are laminated via an insulating layer 51a the wavelength conversion layer 52a for converting ultraviolet light into green light and the wavelength conversion layer 53a for converting ultraviolet light into red light.

The insulating layer 51a, wavelength conversion layer 52a for converting ultraviolet light into green light and wavelength conversion layer 53a for converting ultraviolet light into red light may use the insulating layer 51 and wavelength conversion layers 52 and 53 of the eighth embodiment.

The white light LED's of the eighth and ninth embodiments convert the ultraviolet light among ultraviolet light and blue light emitted from the emission layer using the embodiment ZnO(Se) layer into green light and red light. Blue light emitted from the emission layer and green light and red light generated in the wavelength conversion layers are mixed to generate white light.

As described with the fifth and sixth embodiments, LEDs of the eighth and ninth embodiments can omit the n-type ZnMgO layer 24, or both the p-type ZnMgO layer 26 and n-type ZnMgO layer 24. The emission layer 25 of a double hetero (DH) structure may be formed by sandwiching a single ZnO(Se) layer between the n-type ZnMgO clad layer 24 and p-type ZnMgO clad layer 26.

Although white light is generated by the structure that blue light, green light and red light are mixed, the structure for generating white light is not limited thereto. For example, instead of the wavelength conversion layers for generating green light and red light, a wavelength conversion layer may be used for emission of complementary color of blue, i.e., yellow.

Next, with reference to FIG. 8, a white color LED of the tenth embodiment will be described. An LED 61 for emitting ultraviolet light UV and blue light B of the fifth or sixth embodiment is sealed by sealing resin 71. Mixed in the sealing resin 71 are phosphors 72 for converting ultraviolet light UV emitted from LED 61 into green light G and phosphors 73 for converting ultraviolet light UV emitted from LED 61 into red light G.

White light W is obtained by mixing the blue light B emitted from LED 61, the green light G generated by the phosphors 72 and the red light R generated by the phosphors 73.

A conventional structure of a white color LED has an LED for blue light emission and phosphors for converting blue light emitted from LED into green light and red light. A blue light emission LED is made of, GaN-containing material, ZnSe-containing material or the like.

In the white color LED of the eighth to tenth embodiments, the ultraviolet light among ultraviolet light and blue light emitted from the emission layer is used for exciting the wavelength conversion material for generating light of a color other than the blue color.

Another conventional structure of a white color LED has an LED for ultraviolet light emission and phosphors for converting ultraviolet light emitted from LED into blue light, green light and red light. This white color LED requires three types of phosphors for blue light emission, green light emission and red light emission.

Since the emission layer of the white color LED's of the eighth to tenth embodiments emits both ultraviolet light and blue light, it is not necessary to use a phosphor for blue light emission. Since the number of necessary phosphor types is reduced, it is expected that the number of white color LED manufacture processes and a manufacture cost are reduced. Since the amount of phosphorous substance can be reduced, inner reflection of the phosphor is suppressed and a brightness of white color can be improved.

Next, a white color LED of the eleventh embodiment will be described with reference again to FIG. 8. Different points from the tenth embodiments reside in that the phosphors 72 do not generate green light G, but generate yellow light Y which is a complementary color of blue, and that the phosphors 73 are omitted. The phosphors 72 for generating yellow light Y may convert blue light B emitted from LED 61 into yellow light Y, or ultraviolet light emitted from LED 61 into yellow light Y.

The white color LED of the eleventh embodiment generates white light by mixing blue light B emitted from LED 61 and yellow light Y generated by the phosphors 72. Since the phosphors 73 for red light emission are added, color rendering properties can be improved.

Figure 9A:
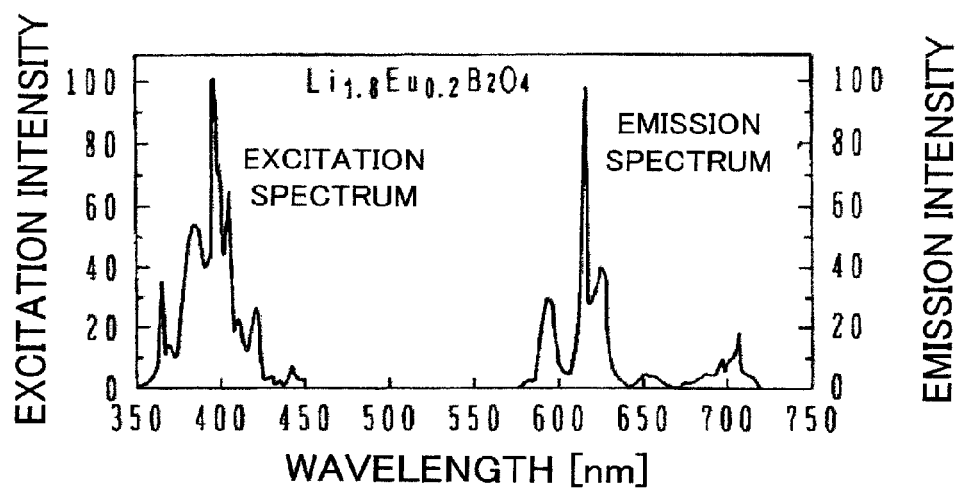
FIG. 9A shows excitation and emission spectra of $Li_{1.8}Eu_{0.2}B_2O_4$.

The phosphors 73 convert ultraviolet light UV emitted from LED 61 into red light R. The red light emission phosphors 73 to be excited by ultraviolet light may be made of $Li_{1.8}Eu_{0.2}B_2O_4$. FIG. 9 shows an excitation spectrum and an emission spectrum of $Li_{1.8}Eu_{0.2}B_2O_4$.

An example of such phosphors is disclosed in JP-A-2004-123764.

A conventional structure of an LED for obtaining white light having improved color rendering properties by mixing red light with blue light and yellow light has an LED for blue light emission and phosphors for converting blue light emitted from LED into yellow light and red light. The white color LED of this type has a fear that yellow light (main wavelength of 560 nm) generated by the phosphors for yellow light emission is absorbed in the phosphors for red light emission.

Figure 9B:
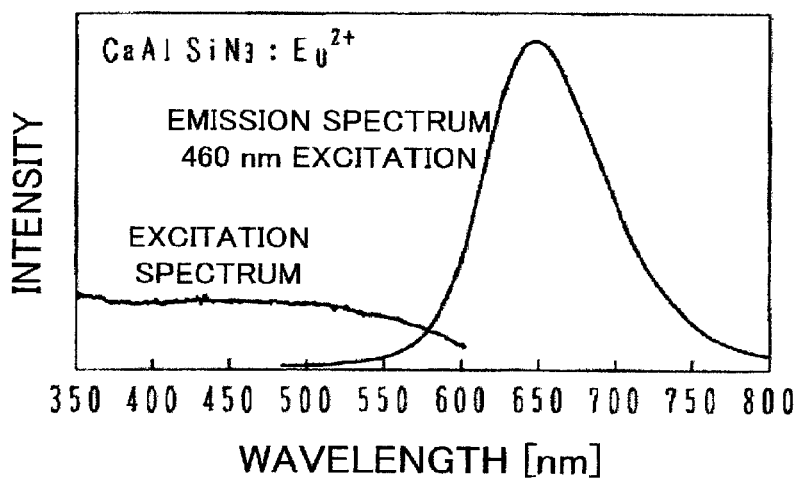
FIG. 9B shows excitation and emission spectra of $CaAlSiN_3:Eu^{2+}$.

Red light emission phosphors to be excited by blue light and used in the white color LED of this type may be made of $CaAlSiN_3:Eu^{2+}$. FIG. 9B shows an excitation spectrum and an emission spectrum (460 nm excitation) of $CaAlSiN_3:Eu^{2+}$±.

In the white color LED of the eleventh embodiment, the red light emission phosphors convert not blue light but ultraviolet light into red light. Yellow light generated by the yellow light emission phosphors is hard to be absorbed in the red light emission phosphors so that an intensity of yellow light can be suppressed from being lowered.

Next, a white color LED of the twelfth embodiment will be described with reference also to FIG. 8. In the white color LED of the twelfth embodiment, similar to the eleventh embodiment, the phosphors 72 generate yellow light Y. However, the phosphors 73 for red light emission are omitted.

Figure 10:
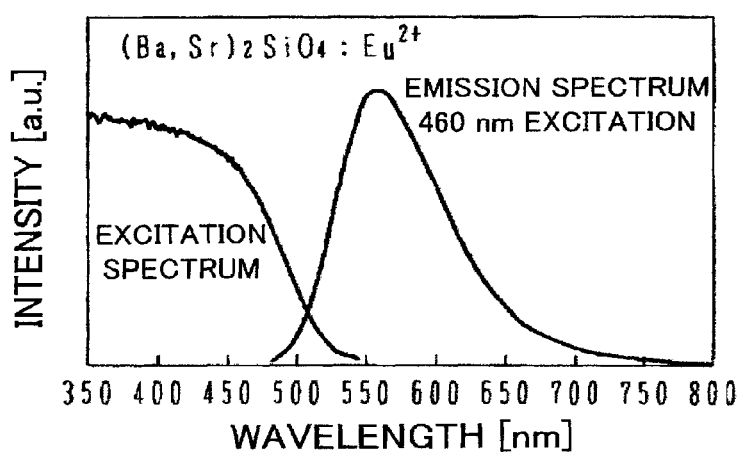
FIG. 10 shows excitation and emission spectra of $(Ba, Sr)_2SiO_4:Eu^{2+}$.

The yellow light emission phosphors of this embodiment may be made of $(Ba, Sr)_2SiO_4:Eu^{2+}$. FIG. 10 shows an excitation spectrum and an emission spectrum (460 nm excitation) of $(Ba, Sr)_2SiO_4:Eu^{2+}$.

A conventional structure for generating white light by mixing blue light and yellow light has an LED for blue light emission (e.g., a GaN-containing LED at an emission wavelength of 460 nm) and yellow light emission phosphors to be excited by blue light emitted from LED. This structure has a fear that an intensity of blue light is lowered and a chromaticity is shifted.

In the twelfth embodiment, the emission layer emits near ultraviolet light at a wavelength of about 380 nm and blue light at a wavelength of about 450 nm Since an intensity of the excitation spectrum of the yellow light emission phosphors shown in FIG. 10 is higher on the ultraviolet light side than on the blue light side, more efficient excitation by near ultraviolet light is expected than excitation only by blue light. It is therefore possible to suppress the blue light intensity from being lowered and the chromaticity from being shifted. Further, as the excitation efficiency is improved, the amount of yellow light emission phosphorous substance can be reduced. It is therefore possible to suppress inner reflection in the phosphors and a brightness of white light can be expected to be improved.

In the above embodiments, by adding Se to the ZnO layer, both ultraviolet light emission and blue light emission can be obtained at the same time. As described in the following, if S is added to the ZnO layer, ultraviolet light emission and green light emission can be obtained at the same time.

Next, description will be made on a method of growing a ZnO layer added with S (ZnO(S) layer) according to the thirteenth embodiment. First, the +c plane (Zn plane) of a c plane ZnO substrate was subjected to thermal annealing to clean the substrate surface. The thermal annealing was performed for 30 minutes at 900° C. under a high vacuum of $1\times10^{-9}$ Torr.

Next, a Zn beam and an O radical beam were radiated at the same time to the +c plane of the ZnO substrate to form a ZnO buffer layer. The substrate temperature was set to 350° C. The Zn beam was radiated at a beam flux of 9.86E×13 atoms/(cm$^2$sec) by using Zn at a purity of 7N as a solid source. The O radical beam was radiated by supplying pure oxygen gas at a purity of 6N at 2 sccm and making O plasm at an RF power of 300 W.

Next, the ZnO buffer layer was annealed at a substrate temperature of 800° C. The substrate was maintained at 800° C. for 20 minutes.

Next, a Zn beam, an O radical beam and a ZnS beam were radiated at the same time to the annealed ZnO buffer layer to grow a ZnO(S) layer. The substrate temperature was set to 700° C.

The Zn beam was radiated at a beam flux of 6.58E+14 atoms/(cm$^2$sec) by using Zn at a purity of 7N as a solid source. The O radical beam was radiated by supplying pure oxygen gas at a purity of 6N at a flow rate of 2 sccm and making O plasma at an RF power of 300 W. The ZnS beam was radiated at a beam flux not more than 2.51E+14 atoms/(cm$^2$sec) by using ZnS at a purity of 5N as a solid source. A ZnS/Zn flux ratio is about 0.4.

Next, description will be made on a method of growing a ZnO(S) layer according to the fourteenth embodiment. The ZnO(S) layer was formed by a method similar to the growth method of the thirteenth embodiment, excepting that the beam flux of ZnS during the ZnO(S) layer forming process was set to 1.32E+14 atoms/(cm$^2$sec). A ZnS/Zn flux ratio is about 0.2.

S concentrations in the ZnO(S) layers formed by the thirteenth and fourteenth embodiments measured through composition analysis by energy dispersive X-ray analysis (EDX) were not higher than 0.1 atom % (not higher than a measurement lower limit of EDX).

Figure 11:
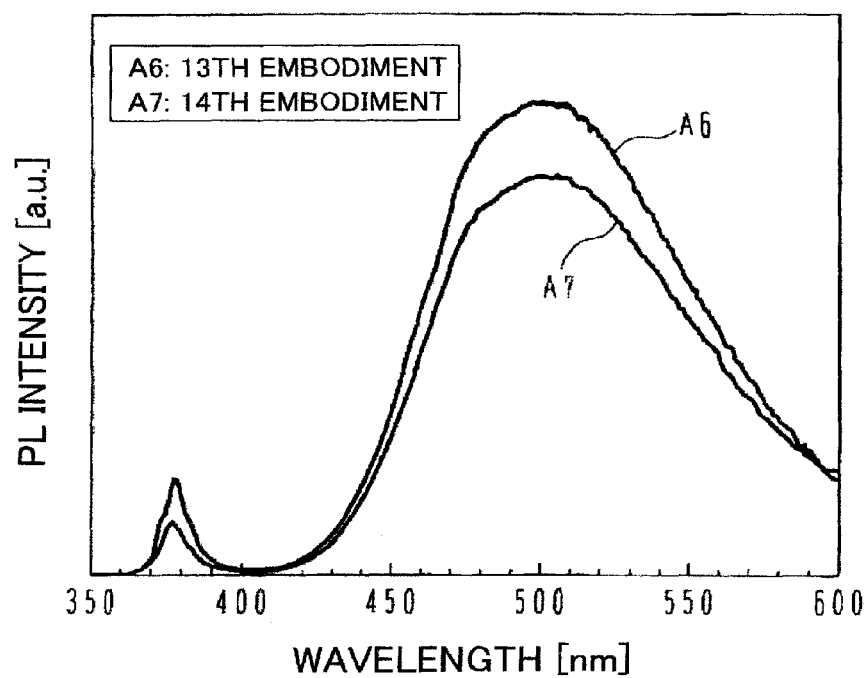
FIG. 11 shows PL spectra of the ZnO(S) layers of thirteenth and fourteenth embodiments.

FIG. 11 shows PL spectra of ZnO(S) layers of the thirteenth and fourteenth embodiments. As an excitation light source for PL measurements, He—Cd laser at a wavelength of 325 nm was used. A measurement temperature was 300 K. An abscissa of the graph represents a wavelength in the unit of nm, and the ordinate represents an emission intensity in an arbitrary unit. Curves A6 and A7 indicate spectra of the thirteenth and fourteenth embodiments, respectively.

It is remarkable that both the ZnO(S) layers of the thirteenth and fourteenth embodiments exhibit ultraviolet light emission having an emission peak near at 380 nm and green light emission having an emission peak near at 500 nm By adding S to ZnO, both ultraviolet light emission and green light emission can be obtained from a single ZnO(S) layer.

Ultraviolet light emission peak wavelengths of the ZnO(S) layers of the thirteenth and fourteenth embodiments are both 380 nm Similar to the ZnO(Se) layers of the above-described embodiments, it can be considered that the ultraviolet light emission peak wavelength is in the range of 340 nm to 380 nm.

Visual light emission peak wavelengths of the ZnO(S) layers of the thirteenth and fourteenth embodiments are 490 nm and 510 nm, respectively. A visual light emission peak wavelength of the ZnO(S) layer is considered to be in the range of 490 nm to 510 nm. A full width at half maximum of the visual light emission peak is 50 nm or wider.

If both ultraviolet light emission and green light emission are utilized, it may be preferable that an intensity ratio of one emission to the other has some value or larger. For example, it may be preferable that a ratio of an ultraviolet light emission peak intensity to a green light emission peak intensity is not smaller than 1/20 and that a ratio of a green light emission peak intensity to an ultraviolet light emission peak intensity is not smaller than 1/20.

Similar to increasing the Se composition x of $ZnSe_xO_{1-x}$, the band gap of ZnO can narrowed by increasing the S composition y of $ZnS_yO_{1-y}$. However, if a dose is increased to the extent that the S composition y becomes 0.01 or larger, an emission peak corresponding to the narrowed band gap will not be observed, but only emission at a deep level can be observed (refer to FIG. 7B of the eighth embodiment).

If a $ZnS_yO_{1-y}$ layer with an S composition y suppressed lower than 0.01 (lower than 1%) is formed by the embodiment methods, it can be considered that while a band gap is maintained as that of ZnO, i.e., while an ultraviolet light emission peak corresponding to the ZnO band gap is maintained, green light emission peak can be obtained additionally It is expected to be effective if the layer is grown at a flux ratio Zn/Zn of 0.4 or smaller.

Similar to the ZnO(Se) layer of the embodiment, the ZnO(S) layer of this embodiment is expected to be applied to the emission layer of LED. Since the ZnO(S) layer of the embodiment exhibits both ultraviolet light emission and green light emission, a wavelength conversion member for converting ultraviolet light into blue light and a wavelength conversion member for converting ultraviolet light into red light are used when a white color LED mixing three primary colors of blue, green and red is manufactured. An example of phosphors for blue light emission by near ultraviolet light excitation near at 380 nm is $(Sr, Ca, Ba, Mg)_{10}(PO_4)_6Cl_2:Eu^{2+}$.

As described so far, by adding Se or S to ZnO, a ZnO-containing semiconductor layer can be obtained having both an ultraviolet light emission peak wavelength and a visual light emission peak wavelength, even if the layer is a single layer. As a visual light emission peak wavelength, blue light is obtained by adding Se whereas green light is obtained by adding S.

The ZnO-containing semiconductor material of this type can be used for an emission layer of a light emitting device. Of ultraviolet light and visual light emitted from a ZnO-containing semiconductor material, the ultraviolet light can be used for exciting wavelength conversion material.

As the wavelength conversion material generates visual light having an emission peak wavelength different from that of visual light emitted from the ZnO-containing semiconductor material, light emitting devices can be manufactured emitting light of various colors (e.g., white) by mixing color of visual light emitted from the ZnO-containing semiconductor material with color of visual light generated by the wavelength conversion material. By using ultraviolet light emitted from the ZnO-containing semiconductor material for excitation of the wavelength conversion material, it becomes possible to suppress an intensity of visual light emitted from the ZnO-containing semiconductor material from being lowered.

In the above embodiments, although MBE is used for forming films, other film forming methods may also be used, such as metal organic chemical vapor deposition (MOCVD) and pulse laser deposition (PLD).

In the above embodiments, although LED's are manufactured by way of example, for example, laser diodes (LD) may also be manufactured by forming a cavity by cleavage. Furthermore, application products of these can also be manufactured such as various indicators, LED displays, LD displays, illumination apparatus, and back light illumination for displays.

The present invention has been described in connection with the preferred embodiments. The invention is not limited only to the above embodiments. It will be apparent to those skilled in the art that other various modifications, improvements, combinations, and the like can be made.

What we claim are:

1. A ZnO-containing semiconductor layer containing Se in addition to ZnO, wherein the ZnO-containing semiconductor layer has an emission peak wavelength of ultraviolet light corresponding to a band gap of ZnO and an emission peak wavelength of visual light, wherein an Se concentration in said ZnO-containing semiconductor layer is between 0.001% and 0.26%.

2. The ZnO-containing semiconductor layer according to claim 1, wherein the emission peak wavelength of said visual light is blue.

3. The ZnO-containing semiconductor layer according to claim 1, wherein the emission peak wavelength of said visual light is in a range of 430 nm to 490 nm.

4. A ZnO-containing semiconductor light emitting device comprising:
a first semiconductor layer of a first conductivity type;
a second semiconductor layer of a second conductivity type opposite to the first conductivity type;
an emission layer including a ZnO-containing semiconductor layer sandwiched between said first and second semiconductor layers;
a first electrode electrically connected to said first semiconductor layer; and
a second electrode electrically connected to said second semiconductor layer,
wherein said ZnO-containing semiconductor layer contains Se in addition to ZnO and has an emission peak wavelength of ultraviolet light corresponding to a band gap of ZnO and an emission peak wavelength of visual light; and
wherein an Se concentration in said ZnO-containing semiconductor layer is between 0.001% and 0.26%.

5. The ZnO-containing semiconductor light emitting device according to claim 4, further comprising a wavelength conversion layer containing first wavelength conversion material which is excited by the ultraviolet light emitted from said ZnO-containing semiconductor layer and emits light having a first emission peak wavelength of visual light that is different from the emission peak wavelength of visual light emitted from said ZnO-containing semiconductor layer.

6. The ZnO-containing semiconductor light emitting device according to claim 5, wherein said first wavelength conversion material is first phosphor, and said wavelength conversion layer is a sealing resin layer containing said first phosphor.

7. The ZnO-containing semiconductor light emitting device according to claim 6, wherein the emission peak wavelength of the visual light emitted from said ZnO-containing semiconductor layer is blue, and said first phosphor is excited by the ultraviolet light and emits yellow light.

8. The ZnO-containing semiconductor light emitting device according to claim 7, wherein said sealing resin layer further contains phosphor for emitting red light.

9. The ZnO-containing semiconductor light emitting device according to claim 5, wherein said first wavelength conversion material is first semiconductor, and said wavelength conversion layer is a layer of said first semiconductor.

10. The ZnO-containing semiconductor light emitting device according to claim 5, wherein said wavelength conversion layer further contains second wavelength conversion material which is excited by the ultraviolet light emitted from said ZnO-containing semiconductor layer and emits light having a second emission peak wavelength of visual light that is different both from the emission peak wavelength of visual light emitted from said ZnO-containing semiconductor layer and from the first emission peak wavelength of the first wavelength conversion material.

11. The ZnO-containing semiconductor light emitting device according to claim 10, wherein said first and second wavelength conversion materials are first and second phosphors.

12. The ZnO-containing semiconductor light emitting device according to claim 11, wherein said wavelength conversion layer includes a layer of said first phosphor and a layer of said second phosphor.

13. The ZnO-containing semiconductor light emitting device according to claim 12 wherein the emission peak wavelength of the visual light emitted from said ZnO-containing semiconductor layer is blue, said first wavelength conversion material contains ZnSeO and the first emission peak wavelength of visual light is red, and said second wavelength conversion material contains ZnSO and the second emission peak wavelength of visual light is green.

14. The ZnO-containing semiconductor light emitting device according to claim 11, wherein said wavelength conversion layer is a sealing resin layer containing said first and second phosphors.

15. The ZnO-containing semiconductor light emitting device according to claim 10, wherein said first and second wavelength conversion materials are first and second semiconductors, and said wavelength conversion layer includes a layer of said first semiconductor and a layer of said second semiconductor.

16. The ZnO-containing semiconductor light emitting device according to claim 4, wherein the emission peak wavelength of the visual light is blue.

* * * * *